United States Patent [19]

Engemann

[11] Patent Number: 4,898,557
[45] Date of Patent: Feb. 6, 1990

[54] PROCESS FOR PREPARING EXTRACTION GRIDS

[75] Inventor: Jürgen Engemann, Wuppertal, Fed. Rep. of Germany

[73] Assignee: Leybold Aktiengesellschaft, Hanua, Fed. Rep. of Germany

[21] Appl. No.: 193,149

[22] Filed: May 6, 1988

Related U.S. Application Data

[63] Continuation of Ser. No. 881,634, Jul. 3, 1986, abandoned.

[30] Foreign Application Priority Data

Jan. 21, 1986 [DE] Fed. Rep. of Germany ....... 3601632

[51] Int. Cl.$^4$ .................... H01J 09/24; H01J 09/00
[52] U.S. Cl. .................................. 445/49; 445/11; 445/24
[58] Field of Search ............... 445/9, 11, 12, 14, 24, 445/46, 49; 427/250

[56] References Cited

U.S. PATENT DOCUMENTS

| | | | |
|---|---|---|---|
| 2,721,950 | 10/1955 | Piper | 445/24 |
| 2,967,962 | 1/1961 | Turk | 445/11 |
| 3,687,513 | 8/1972 | Holz | 445/24 |
| 3,716,742 | 2/1973 | Nakayama | 445/24 |
| 3,743,879 | 7/1973 | Kupsky | 445/24 |
| 3,822,454 | 1/1974 | Speigel | 445/11 |
| 4,318,026 | 3/1982 | D'Amato | 445/49 |
| 4,534,744 | 8/1985 | Kuznetzoff | 445/11 |

FOREIGN PATENT DOCUMENTS 3411975 10/1985 Fed. Rep. of Germany ........ 445/24

Primary Examiner—Kurt Rowan
Attorney, Agent, or Firm—Felfe & Lynch

[57] ABSTRACT

Process for producing extraction grids for ion sources. A mounting plate (1) of a thermostable material is provided on both sides with a continuous metal coating (2, 3). An essentially congruent pattern of holes is produced in the mounting plate (1) and in the metal coatings (2, 3). In such an extraction system, the metal coatings, electrically separated on either side, form extraction grids or electrodes. By disposing a core region (1a) of a conducting or semiconducting material in the mounting plate (1), a third electrode can be produced for controlling the ion beam.

11 Claims, 2 Drawing Sheets

2cm

PROCESS FOR PREPARING EXTRACTION GRIDS

This application is a continuation of application Ser. No. 881,634, filed July 3, 1986, now abandoned.

The process relates to a process for producing extraction grids for ion sources.

Such ions sources with extraction grids, as well as the intent and purpose of such extraction grids, are known from U.S. Pat. No. 4,507,588. An essential part of the ion source is a chamber, in which the plasma is produced and which has an opening, in which at least two extraction grids are disposed in series connection, by means of which the plasma is pulled out of said chamber and accelerated in the direction of a body, which is to be processed, the so-called substrate. The known extraction grids comprise grid-shaped, perforated metal sheets, through the holes of which individual oriented ion beams pass. These perforated metal sheets are associated with some problems, which will be examined in greater detail below.

In the area of microstructure technique, efficient ion sources with large-area extraction grids, which are also referred to as "multiaperture optics", are required for the deposition of high-quality thin layers of metallic and nonmetallic materials, as well as for the structuring in the low micrometer region. The largest ion sources, used at the present time on a commercial scale, are based on the Kaufman principle, that is, electrons are passed through emitters (for example, filaments, hollow cathodes) into the plasma chamber by means of a d.c. voltage. Such ion sources enable maximum current densities of about 4 mA/cm$^2$ to be reached for maximum beam diameters of about 16 cm. The ion energies are moreover adjustable from 150 to 2,000 eV.

The extraction of ions from the plasma and the guidance of the beam are determined essentially by the extraction optics used, which may be formed by two or more grid systems or also by only one grid. In this connection, the following criteria are particularly important:

1. In the interests of higher current densities, the extraction optics must be thermostable, and moreover with respect to a time delay of the individual optics and with respect to a mutual maladjustment of the individual grids. On account of the presently available materials, the maximum temperature of the grids is about 200° C.

2. It should be possible to scale the whole surface of the extraction grid. If the beam diameter of 16 cm, given above, is exceeded, difficulties are encountered due to the maximum temperatures to which the grids may be exposed.

3. The distance between the grids should satisfy certain conditions, this distance determining the maximum extractable ion current density J. The following proportionality applies:

$$J = u^{3/2}/d^2$$

in which U is the extraction voltage between the grids and d is the distance between the grids. Thermal effects once again have a limiting effect on the decrease in the distance. Until now, it has not been possible to reduce the distance between grids to below 1 mm.

A small distance d between grids with an aspect ratio (=ratio of average diameter of a grid opening to distance between grids) of 1 also lies in the interest of small extraction voltages, that is of small energies for the so-called ion beam etching process, in which parallel ion beams are formed with energies substantially below 1 keV.

In coating processes of the so-called beam deposition, the ratio changes as follows. Admittedly, the aspect ratio should also be about 1 here; however, because of the higher beam voltages, it should be possible to increase the distance between grids without difficulty, since this distance affects the breakdown voltage, the ion energies and the sputter yield.

The thickness of the extraction grid is also determined by the thermal stress. More particularly, the grid closest to the plasma is exposed to high thermal stresses. In order to be able to counteract a time delay of the individual optics or a maladjustment of the individual grids, it was previously not possible to reduce the thickness of the grid substantially below the value of 1 mm for the ion source indicated above with a beam diameter of 16 cm. The requirement of adequate heat dissipation is diametrically opposed to an extremely low grid density, since thin grids reduce the aberrations as well as increase the extractable ion current densities.

5. For reasons of mechanical stability and thermal stability, the choice of materials for the extraction grid is limited. In the previously known ion sources, predominantly molybdenum, tungsten and graphite were used as grid materials. With argon as working gas and at a specified accelerating voltage, the least possible yields Y are to be aimed for, in order to minimize unwanted contamination of the substrates to be coated. With a vertical incidence of ions and an energy of 1 keV, the following values are typical:

molybdenum (Mo): Y=1.3 tungsten (W): Y=0.8 graphite (C): Y=0.6

According to the above, graphite and tungsten and, to a limited extent, also molybdenum are thoroughly advantageous materials.

The situation worsens when reactive gases are used in the interests of increased selectivities. CF$_4$ frequently is employed as a working gas in semiconductor technology. This gas attacks molybdenum, as well as tungsten. If admixtures of oxygen are used, even graphite is problematical as an electrode material.

It is therefore an object of the invention to provide a manufacturing process for extraction grids, which are thermostable to a large extent and make higher specific extraction currents and larger beam cross sections possible.

This objective is accomplished inventively, owing to the fact that a mounting plate of a thermostable materials is provided on both sides with a continuous metal coating and that an essentially congruent pattern of holes is produced in the mounting plate and in the metal coatings.

In this connection, the mounting plate may comprise a mineral insulating material, such as glass, ceramic or glass-ceramic. The pattern of holes may be produced before as well as after the metal coatings are applied. For example, it is possible to provide the mounting plate on both sides with closed metal coatings and to produce a congruent pattern of holes by an etching process in this sandwich structure. The invention allows great flexibility in the choice of material.

However, according to a further development of the invention, it is particularly advantageous to provide the mounting plate first of all with a pattern of holes, while leaving land unchanged, and subsequently to provide the land on both sides with the continuous coatings, while keeping the holes open. The expression "continuous coatings" implies that, with the exception of the pattern of holes, these coatings are not interrupted and can function as electrodes. The pattern of holes then serves for the passage of the ion beams which, together, form an ion beam of large cross sectional area.

A series of advantages is associated with such extraction optics. First of all, the adjustment of the individual grids relative to one another can be omitted. A shift in the relative position of the two extraction grids is precluded, so that the aligned arrangement of the pattern of holes in the metal coatings on the two sides is maintained even under high thermal stresses. Moreover, the thickness of the mounting plate, which can be chosen to be relatively small, unalterably fixes the distance between the two extraction grids. This distance cannot be changed even if the extraction optics are subjected to high thermal stresses. The mechanical stress on the extraction grids is slight, since they are not self-supporting, but are supported by the mounting plate. Thin metal coatings of the order of 0.1 mm are entirely realizable for mounting plates 0.2 to 0.4 mm thick, that is, the distance d, given above, amounts to exactly this 0.2 to 0.4 mm. As a result of this, the maximum ion current density can be increased correspondingly. Moreover, it is possible to manufacture large-area extraction optics for beam diameters in excess of 16 cm and, after a longer peiod of operation, the extraction optics can also be regenerated by remetallizing. Above all however, the ion current density can be increased appreciably relative to the state of the art, maximum extraction optics temperatures of about 550° C. being entirely possible.

As material for mounting plate, a totally or partially photosensitive material may preferably be used, which is exposed according to the pattern of holes and the pattern of holes is produced subsequently by an etching process. A material, which is very suitable for the mounting plate, is sold by Schott Glaswerke in Mainz/BRD under the name of "FOTURAN". After being exposed through a mask to UV light and subsequently subjected to a heat treatment, this material is converted locally into a crystalline or etchable phase, which can be dissolved out from the remaining material by a subsequent etching process. The material in question has a pronounced anisotropic etching behavior, so that the pattern of holes produced is bounded by sidewalls running almost perpendicular to the mounting plate.

The metal coatings can be applied on both sides of a mounting plate, so prepared with a pattern of holes, by a conventional coating process, such as plating or galvanizing. However, a physical vacuum process, such as the vacuum metallizing or cathode sputtering process, is particularly advantageous. With such processes, a very selective coating can be produced by using a mask.

Provided that the metal coatings are applied on both sides of a mounting plate that is already provided with a pattern holes, it is advisable to close the holes temporarily with a material, which can easily be dissolved out, in order to prevent bridging formations between the metal coatings on either side.

Since vacuum coating is a relatively slow process, metal coatings, so applied, can subsequently be intensified by more efficient processes, such as galvanic processes. The choice of metallic material for the extraction grids is largely unrestricted and depends only upon the requirements of the technological use, to which the ion source is to be put.

In producing metal coatings by a vacuum process, it is advisable to apply a thin layer of an adhesion promoting agent, such as chromium, between the mounting plate and the respective coating.

Finally, it is also possible, and moreover particularly, advantageous to use a semiconductor material with anisotropic etching behavior as mounting plate and, to begin with, and to apply on each of the two sides of this mounting plate a layer of insulating material, on which finally the metal coating is applied. "110-Si" may, for example, be used as semiconductor material with anisotropic etching behavior. The layers of insulating material can, preferably, be produced from $SiO_2$ or $Si_3N_4$, and moreover by a thermal evaporation process, a chemical coating process (CVD), by a plasma process or by cathode sputtering. The metal coatings on both sides can be produced by the processes given above.

The metallic or semiconductor material, which occupies the core region of the mounting plate, can at the same time also be used as an electrically biased control electrode for manipulating the beam profile electrostatically, as explained in greater detail by means of FIG. 4.

The core region may, moreover, also be referred to as a third electrode. If the extraction optics comprise more than three grids, several mounting plates become necessary, each of which, in turn, can accommodate two (or three) grids. The technology of the manufacturing process remains unchanged; however, it becomes necessary to adjust the two mounting plates with metal coatings relative to each other. If, however, ion sources with an adequate beam current density are available even at extraction voltages below one kV (so-called ECR microwave ion sources), then two extraction grids, that is, one mounting plate, are usually sufficient.

Further advantageous developments of the object of the invention arise out of the remaining dependent claims.

The invention relates to an extraction grid for ion sources, which is inventively characterized by a mounting plate of a thermostable material, with continuous but electrical separate metal coatings on either side and by an essential congruent pattern of holes that passes through the metal coatings and the mounting plate.

Such an extraction grid may preferably contain a third electrode owing to the fact that the mounting plate has a core region of a metallic or semiconductor material, bordered on either side by a layer of insulating material, on each of which there is a layer of metal.

Examples of the operation of the object of the invention are described in greater detail by means of FIGS. 1 to 4.

FIG. 1 shows a plan view of one of the two plane-parallel surfaces of a system of extraction optics.

FIG. 2 a section through a system of extraction optics with two electrodes formed by metal coatings.

Figure 1:
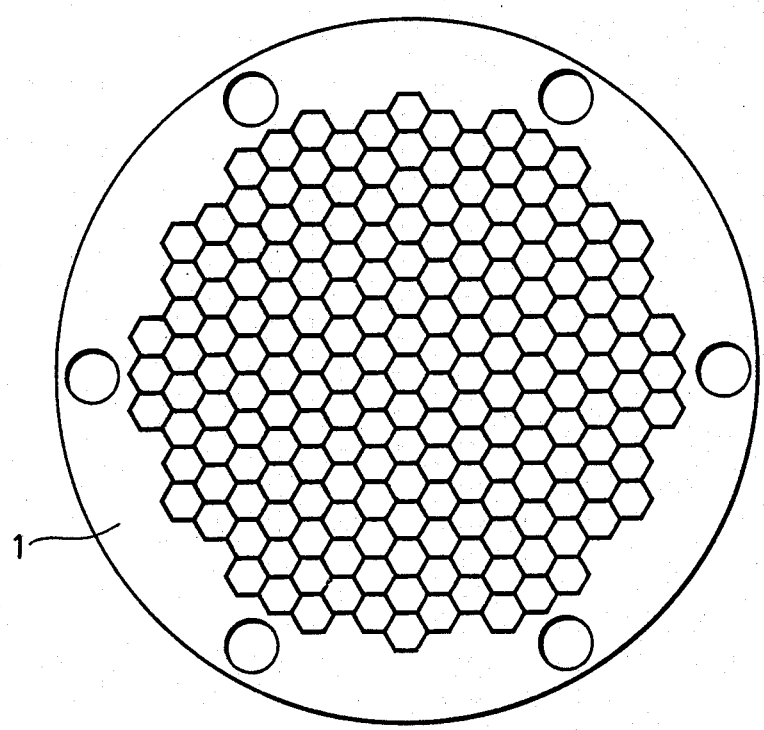

In FIG. 1, a mounting plate 1 of a thermostable, mineral insulating material is shown, which has not yet been provided with the metal coatings, yet already contains the pattern of holes described above. Between the individual holes, there is land, which goes to the edges of a hexagon, so that the pattern of holes is formed and bounded by a sort of honeycomb structure. At the edge of the mounting plate there are six larger holes for screws, with which the mounting plate in the finished state can be connected to an ion source.

Figure 2:
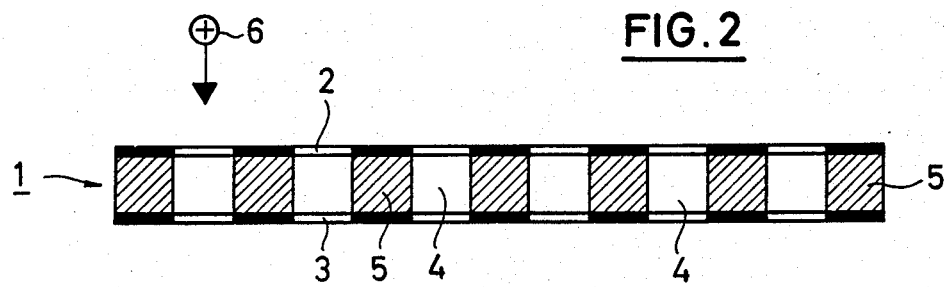

FIG. 2 shows an enlarged cross section through the object of FIG. 1. In this case, the mounting plate is provided on either side with a metal coating 2 and 3, there being a congruent pattern of holes, comprising individual holes 4, in the mounting plate 1 and the metal coatings 2 and 3. In other words the metal coatings 2 and 3 each form a coherent coating only in the region of the land 5.

The upper metal coating 2 is on the so-called plasma side, while the lower metal coating 3 is on the so-called substrate side. The plasma side is indicated by an ion 6.

Figure 3:
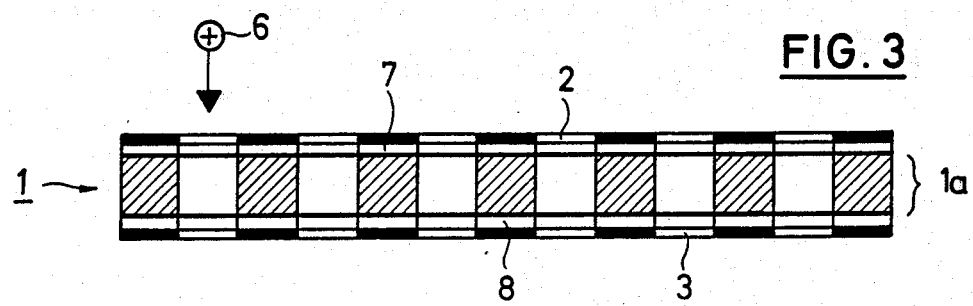
FIG. 3 shows a section through a system of extraction optics with three electrodes formed by two metal coatings and a core region of a metallic or semiconductor material.

In the example of the operation of FIG. 3, the mounting plate 1 comprises a semiconductor material, which is provided with a pattern of holes, analogous to that in FIG. 2. The mounting plate, however, forms a so-called core region 1a, which comprises the semiconductor material and forms a third electrode. This core region has an insulating layer 7 or 8 on each of the two plane-parallel bounding surfaces. These insulating layers, in turn, are provided on their surface with metal coatings 2 and 3, as in FIG. 2.

It can be seen that the core region 1a, the insulating layers 7 and 8 and the metal coatings 2 and 3 are also provided here with a congruent pattern of holes, so that ions 6 can pass through the holes 4 in question.

Figure 4:
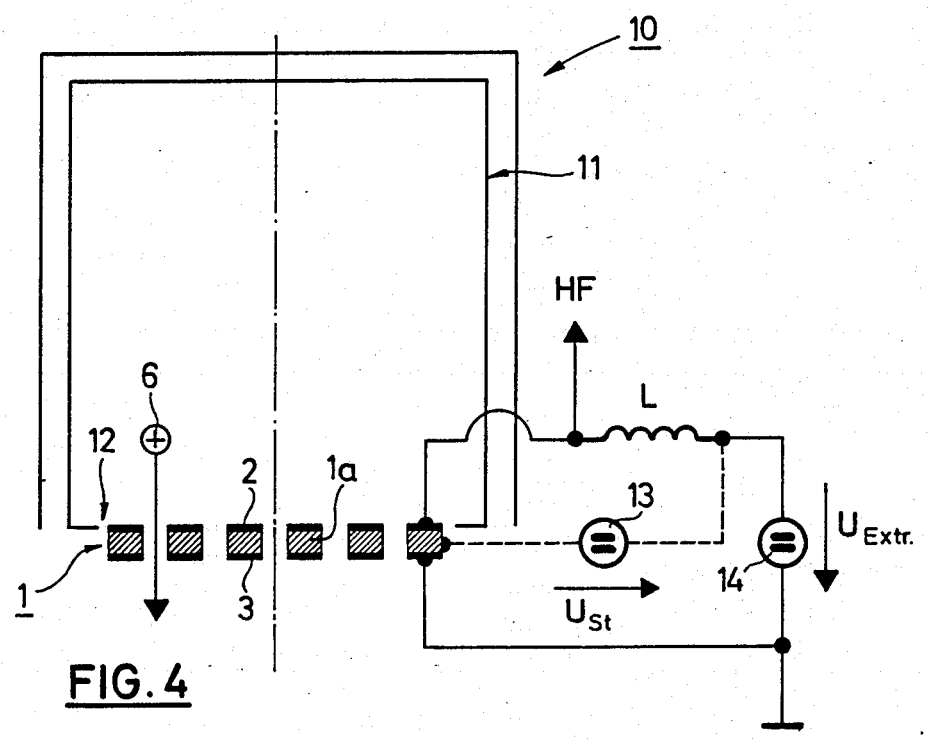
FIG. 4 shows an arrangement of a system of extraction optics, like that in FIG. 3, in combination with an ion source.

FIG. 4 shows an extraction grid of FIG. 3, installed in an ion source 10. The ion source 10 includes a chamber 11, which is associated with a device (not shown in detail) for producing and maintaining a plasma, which comprises ions 6. At its underside, this chamber 11 has an opening 12, which is closed off by the extraction grid with mounting plate 1 of FIG. 3. The metal coatings 2 and 3 are connected in the conventional manner, so that the metal coating 2, which faces the plasma and forms the one extraction grid or the one electrode, is at a positive potential and the metal coating 3, which forms the other extraction grid or the other electrode, is at a ground potential. This arrangement largely ensures that there is no electrical field in the working space, that is, in the region facing electrode 3. By means of applying a variable, positive bias voltage to the core region 1a comprising semiconductor material, the additional possibility opens up of manipulating the beam characteristics according to the control voltage $U_{st}$ and, moreover, for the purpose of influencing the beam characteristics (emittance) and homogenizing the ion beam. For this purpose, the core region 1a, comprising semiconductor material, is connected to a voltage source 13, in which the variable control voltage $U_{st}$ is produced. The so-called extraction voltage $U_{Extr}$ is produced by a further voltage source, which is connected to the metal coatings 2 and 3. A high-frequency source HF, which is indicated only very schematically, serves to excite the plasma in Chamber 11.

By means of the circuit arrangements shown, the interactions between the ions to be extracted and the mounting plate can be reduced, so that their thermal stress can be kept low and parasitic sputtering is reduced at these places.

I claim:

1. A process for producing extraction grids for ion sources comprising:

providing a mounting plate of a thermostable material selected from the group consisting of mineral insulating and semiconducting materials, on both sides with a continuous metal coating, and producing an essentially congruent pattern of holes symmetrical in size and shape extending through the mounting plate and the metal coatings, the step of producing an essentially congruent pattern of holes in the mounting plate and the metal coatings comprising providing the mounting plate with a pattern of holes having links therebetween while leaving the links unchanged, and subsequently providing the links on both sides with continuous metal coatings while keeping the holes open, the area of the coating covering substantially the entire area of the pattern the metal coatings coinciding on both sides of the mounting plate with the mounting plate extending fully to the edges of the metal coatings at the holes and with the holes of the mounting plate being free of overhang by either of the metal coatings.

2. A process in accordance with claim 1, wherein the step of providing a mounting plate comprises using a mounting plate of a totally or partially photosensitive material, and the step of producing an essentially congruent pattern of holes comprises exposing the mounting plate according to the pattern of holes and producing the holes by an etching process.

3. A process in accordance with claim 2, wherein the step of providing a mounting plate comprises providing a mounting plate from a mineral material with anisotropic etching behavior.

4. A process as defined in claim 3, wherein the step of providing a mounting plate comprises providing a mounting plate of a light-sensitive glass material.

5. A process in accordance with claim 1, which includes the step of applying the metal coatings on either side of the mounting plate by a vacuum process.

6. A process in accordance with claim 5, which includes the step of using a mask in the vacuum coating process.

7. A process in accordance with claim 6, comprising, subsequent to the vacuum coating process, augmenting the metal coatings by a process with a higher deposition rate.

8. A process in accordance with claim 1, in which the step of applying metal coatings comprises applying the metal coatings selectively by a masking process and which includes using the metal coatings in a subsequent etching process as etching masks.

9. An extraction grid for ion sources comprising a mounting plate of 0.2 to 0.4 mm thickness of a thermostable material selected from the group consisting of mineral insulating and semiconducting materials, and having on both sides continuous metal coatings which are electrically separated from each other, and having an essentially congruent honeycomb pattern of holes symmetrical in size and shape passing through the metal coatings and the mounting plate, the area of the coatings covering substantially the entire area of the pattern.

10. A process for producing extraction grids for ion sources comprising:

providing a mounting plate of a thermostable material selected from the group consisting of semiconductor materials, on both sides with a continuous metal coating, and producing an essentially congruent pattern of holes symmetrical in size and shape extending through the mounting plate and the metal coatings, wherein the step of providing a mounting plate on both sides with a continuous metal coating comprises providing a mounting plate of a semiconductor material with anisotropic etching behavior and applying on each side of said mounting plate a layer of insulating material and finally applying a metal coating on each layer of insulating material.

11. An extraction grid for ion sources comprising a mounting plate of 0.2 to 0.4 mm thickness of a thermostable material selected from the group consisting of semiconductor materials, and having on both sides continuous metal coatings which are electrically separated from each other, and having an essentially congruent honeycomb pattern of holes symmetrical in size and shape passing through the metal coatings and the mounting plate, and having two layers of insulation adjoining on either side of the mounting plate and which includes the metal coatings outside the two layers of insulation.

* * * * *